US010495960B2

(12) United States Patent
Cho

(10) Patent No.: US 10,495,960 B2
(45) Date of Patent: Dec. 3, 2019

(54) LASER LIGHT SOURCE DEVICE WITH NON-POLARIZED BEAM

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Chun-Hsien Cho, New Taipei (TW)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/117,143

(22) Filed: Aug. 30, 2018

(65) Prior Publication Data

US 2019/0271909 A1    Sep. 5, 2019

(30) Foreign Application Priority Data

Mar. 5, 2018    (CN) .......................... 2018 1 0178473

(51) Int. Cl.
*G03B 21/20* (2006.01)
*G02B 27/30* (2006.01)
*H01S 5/40* (2006.01)
*G02B 27/10* (2006.01)

(52) U.S. Cl.
CPC ....... *G03B 21/2033* (2013.01); *G02B 27/106* (2013.01); *G02B 27/30* (2013.01); *H01S 5/4012* (2013.01); *H01S 5/4025* (2013.01)

(58) Field of Classification Search
CPC .. G03B 21/2033; G03B 27/106; G03B 27/30; H01S 5/4025; H01S 5/4012
See application file for complete search history.

(56) References Cited

U.S. PATENT DOCUMENTS

2018/0329282 A1* 11/2018 Akiyama ............. G03B 21/204

* cited by examiner

*Primary Examiner* — Anne M Hines
(74) *Attorney, Agent, or Firm* — ScienBiziP, P.C.

(57) ABSTRACT

A laser light source device for a laser projection system effectively emitting non-polarized light comprises a laser diode light source array and a collimation lens array. The laser diode light source array comprises N number of laser diodes in a matrix and the collimation lens array comprises a plurality of collimation lenses. Each of the plurality of collimation lenses corresponds to one laser diode of the N number of laser diodes. An outer shell of each laser diode defines a position portion marking a certain orientation, and a gradual angle of polarization is defined and progresses through the N number of laser diodes by reference to the position portion. A predetermined angle difference is applied to each laser diode in the matrix to set the orientation of polarization and substantially achieve a non-polarized light source.

17 Claims, 6 Drawing Sheets

LASER LIGHT SOURCE DEVICE WITH NON-POLARIZED BEAM

FIELD

The subject matter herein generally relates to laser light source devices.

BACKGROUND

Laser light is coherent, has high energy, and is collimated. A common laser projection system may include a laser projector and a projection screen. The laser projector projects images onto the projection screen. The laser projector includes a laser light source to generate a projecting beam. However, beams outputted by laser diodes are polarized beams, such polar beams reduce the image quality of the laser projection system.

Therefore, there is a need of providing an laser light source device to dispose polarization beam appropriately.

BRIEF DESCRIPTION OF THE DRAWINGS

Implementations of the present technology will now be described, by way of example only, with reference to the attached figures.

DETAILED DESCRIPTION

Figure 1:
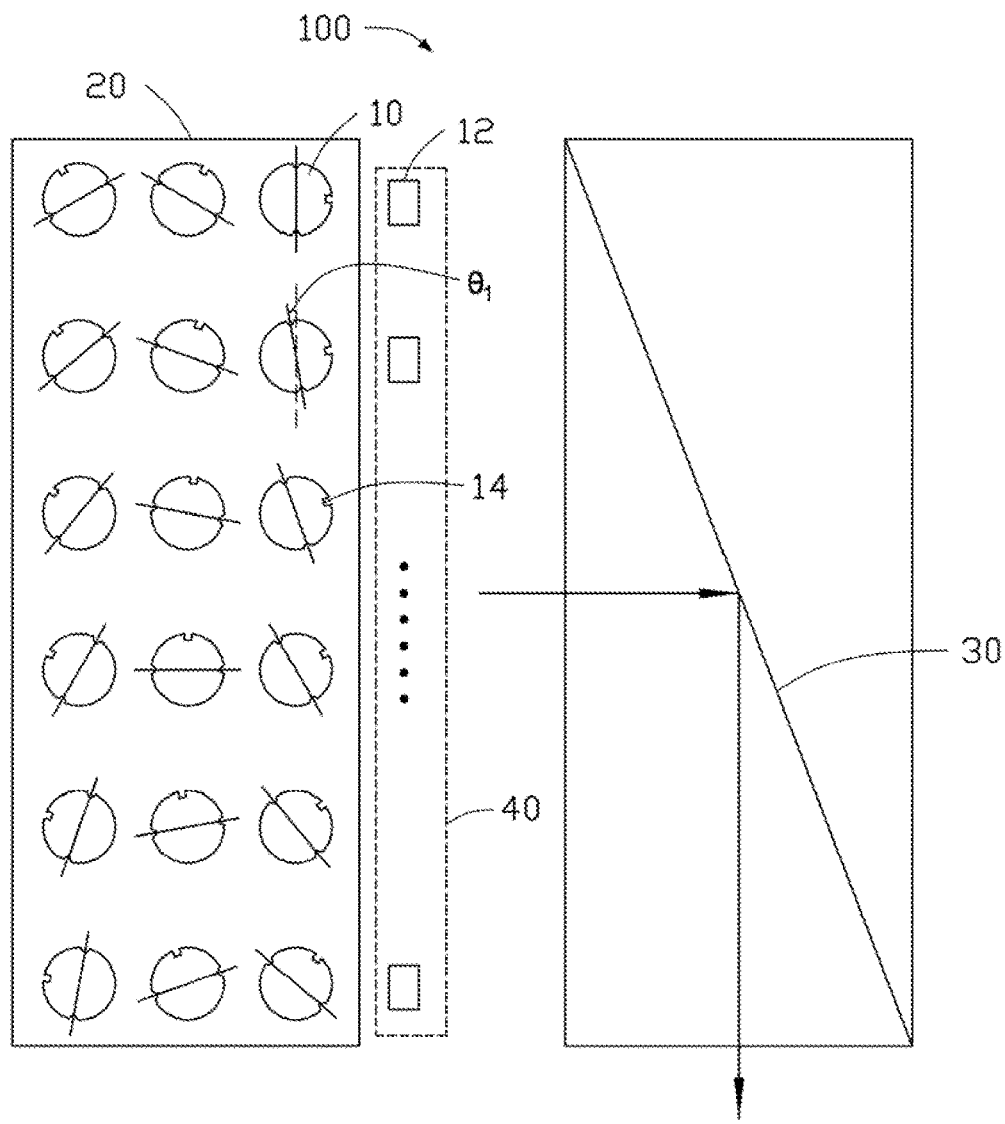
FIG. 1 is a structure diagram of a first embodiment of a laser light source device.
Figure 1:
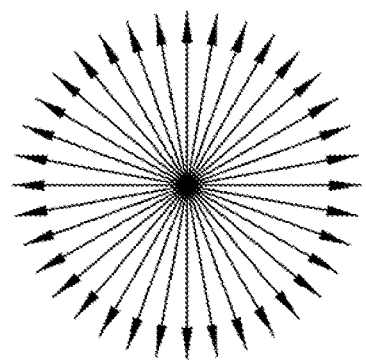

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 illustrates a laser light source device 100 in accordance with an embodiment. The laser light source device 100 can serve as a light source module of a laser projection system (not shown), and the laser projection system can project laser beams to form images.

The laser light source device 100 can comprise a first laser diode light source array 20 and a first collimation lens array 40. The first laser diode light source array 20 can comprise N number of laser diodes 10 and the first collimation lens array 40 can comprise N number of collimation lenses 12. Each collimation lens 12 of the first collimation lens array 40 corresponds to a different laser diode 10 of the first laser diode light source array 20.

For example, the first laser diode light source array 20 comprises eighteen laser diodes 10 and the first collimation lens array 40 comprises eighteen collimation lenses 12. The eighteen laser diodes 10 are arranged to a matrix array of 3*6 and numbered as 1st, 2th, 3th, . . . , 18th. An outer shell of each laser diode 10 defines a position portion 14.

Figure 2:
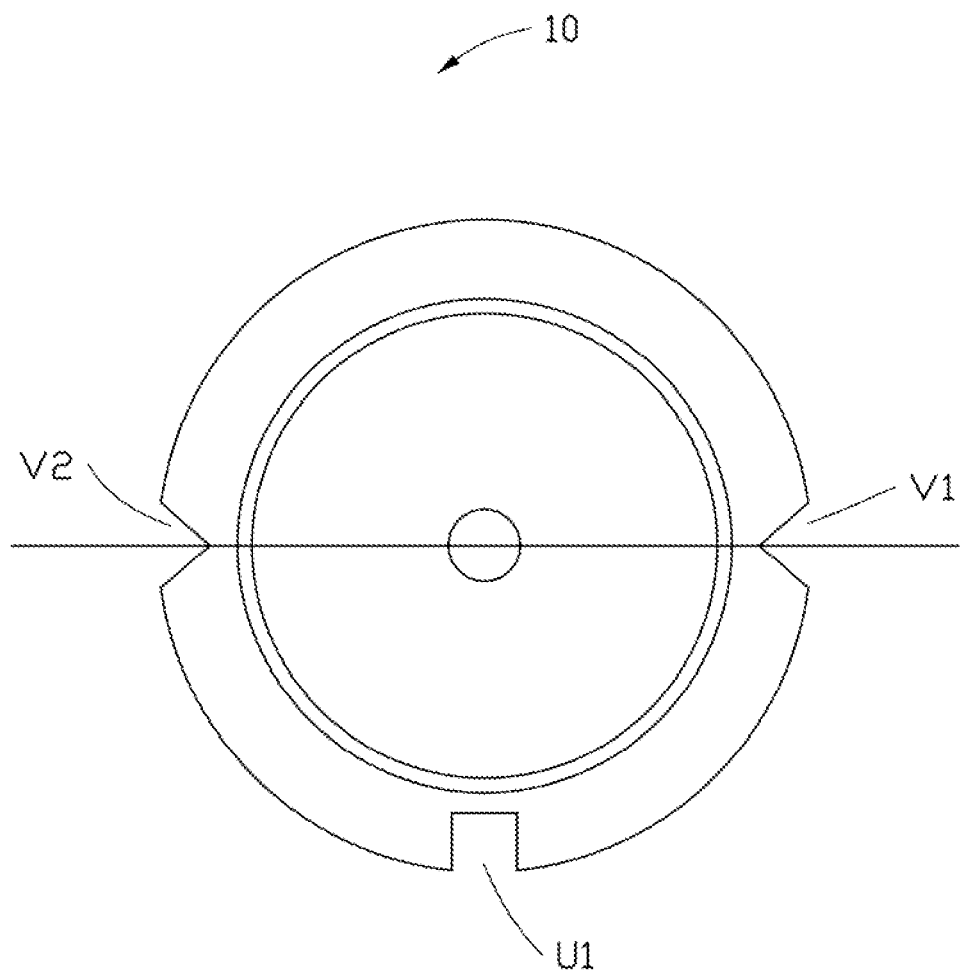
FIG. 2 is a top view of an embodiment of a laser diode in the device of FIG. 1.

Referring to FIG. 2, the outer shell of the laser diode 10 comprises a first V-shaped notch V1, a second V-shaped notch V2, and a U-shaped notch U1. The first V-shaped notch V1 is located opposite to the second V-shaped notch V2 and the U-shaped notch U1 is located between the first V-shaped notch V1 and the second V-shaped notch V2. The position portion 14 can be the U-shaped notch U1 of the laser diode 10.

In one embodiment, the position portion 14 can also be other features of the laser diode 10, for example, first V-shaped notch V1 or the second V-shaped notch V2.

Figure 3:
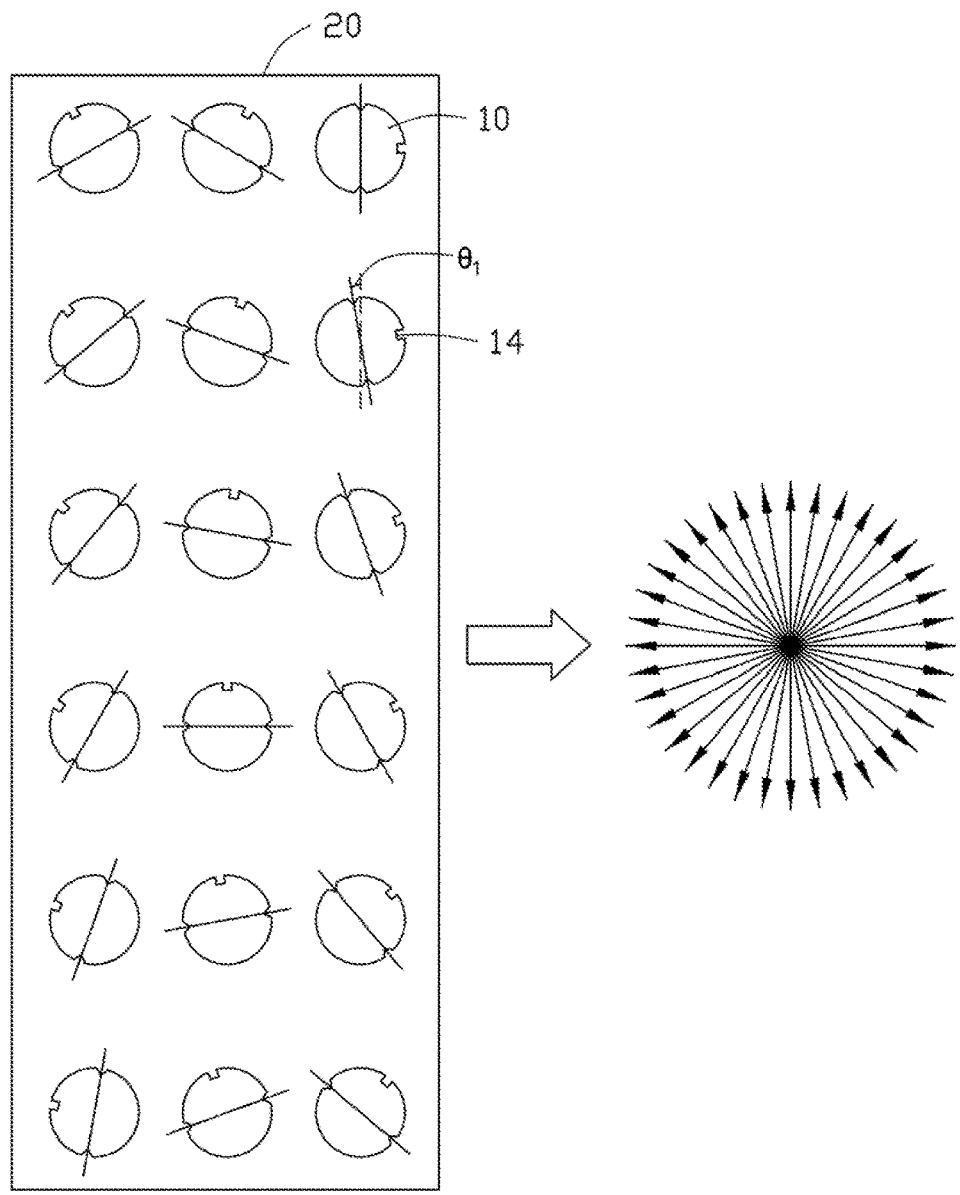
FIG. 3 is an orientation angle diagram of an embodiment of each laser diode of a laser diode light source array in the device of FIG. 1.

Referring to FIGS. 1 and 3, a gradual rotation angle through the 3*6 array is defined among each of the N number of laser diodes 10, and an orientation of a position portion 14 of a Nth laser diode 10 and an orientation of a position portion 14 of a (N−1)th laser diode 10 form a first predetermined angle with an angle difference of θ1.

In one embodiment, the first angle difference θ1 can be calculated by the following formula: $(180°/N)*i$, N and i are positive integers. If the first laser diode light source array 20 comprise eighteen laser diodes 10 (N=18), the first angle difference θ1 can be 10 degrees (i=1), 20 degrees (i=2), 30 degrees (i=3), etc. An orientation angle of the position portions 14 of the 1st to 18th laser diodes 10 can be set as 0, θ1, 2*θ1, 3*θ1, . . . , (N−1)*θ1.

In FIGS. 1 and 3, 1st laser diode 10 is shown located at a top right corner of the first laser diode light source array 20 and 18th laser diode 10 is located at a bottom left corner of the first laser diode light source array 20. The first angle difference θ1 is 10 degrees and, in degrees, the orientation angle of the position portions 14 of the eighteen laser diodes 10 are set as 0 degree, 10 degrees, 20 degrees, 30 degrees, . . . , 170 degrees.

In one embodiment, each laser diode 10 of the first laser diode light source array 20 has the same wavelength. A beam outputted by each laser diode 10 is a polarized beam, a beam outputted by first laser diode light source array 20 can form a combined beam with angle of polarization approximating 360 degrees through the first angle difference θ1 among the eighteen laser diodes 10. Thereby, the laser light source device 100 can effectively function as a non-polarized light source.

In one embodiment, the laser light source device 100 further comprises a first reflector 30 (as shown in FIG. 1). The first reflector 30 reflects a first non-polarized beam outputted from the first collimation lens array 40 into a second non-polarized beam and a light energy density of the second non-polarized beam is higher than a light energy density of the first non-polarized beam outputted from the first collimation lens array 40.

In one embodiment, the first reflector 30 can be a prism module which can realize a total reflection function or a mirror type reflection function module.

Figure 4:
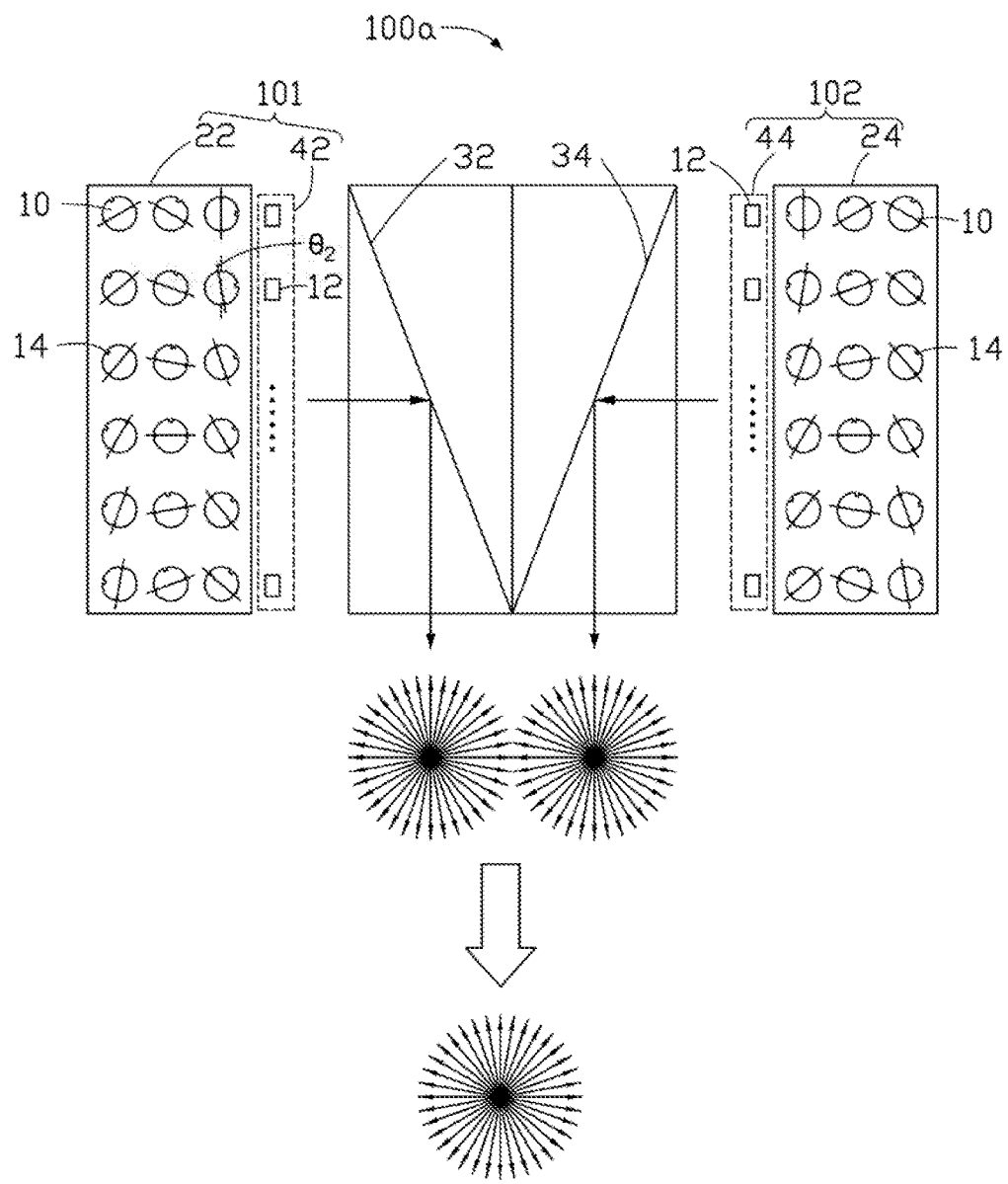
FIG. 4 is a structure diagram of a second embodiment of a laser light source device.
Figure 5:
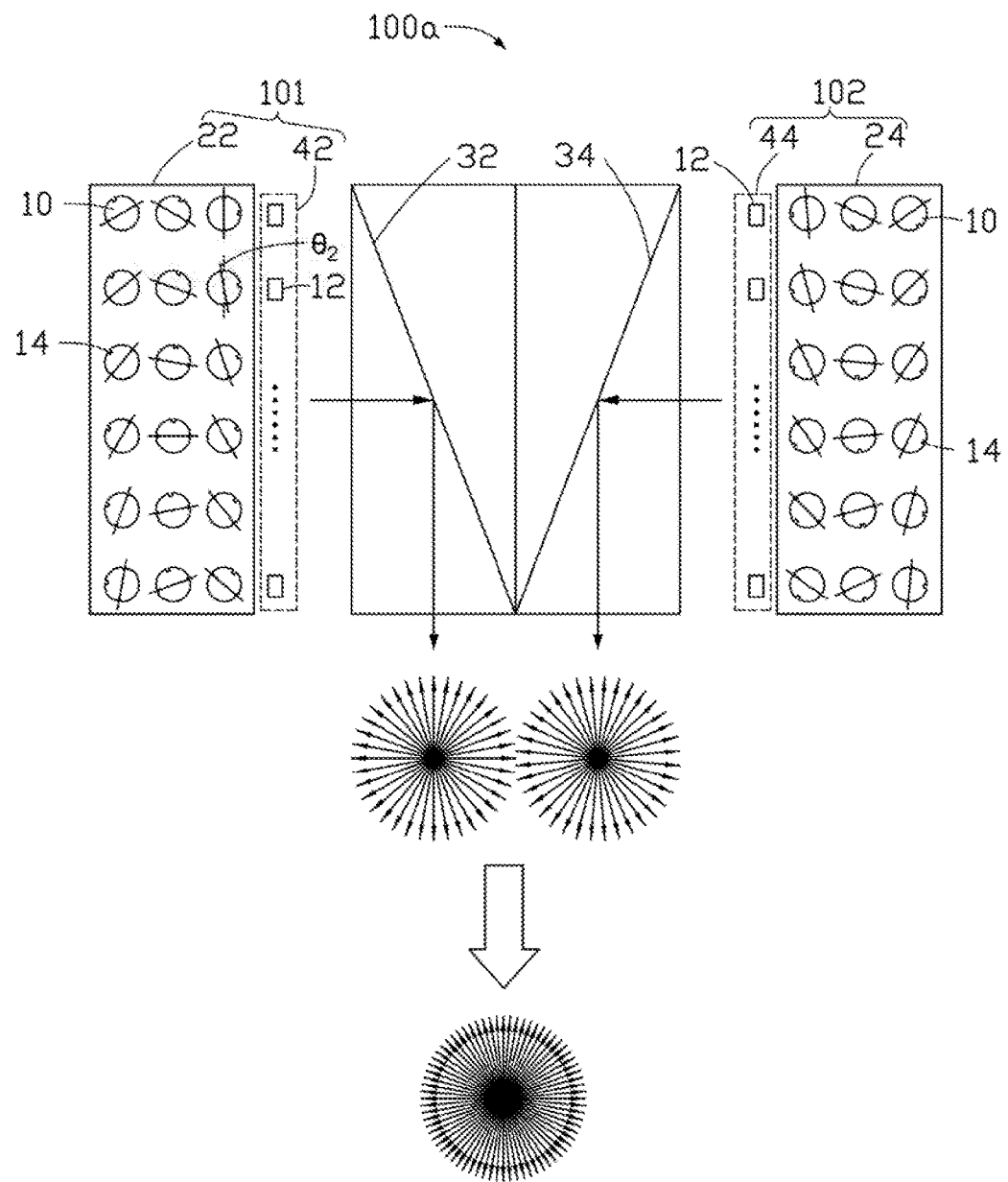
FIG. 5 is a structure diagram of a third embodiment of a laser light source device.
Figure 6:
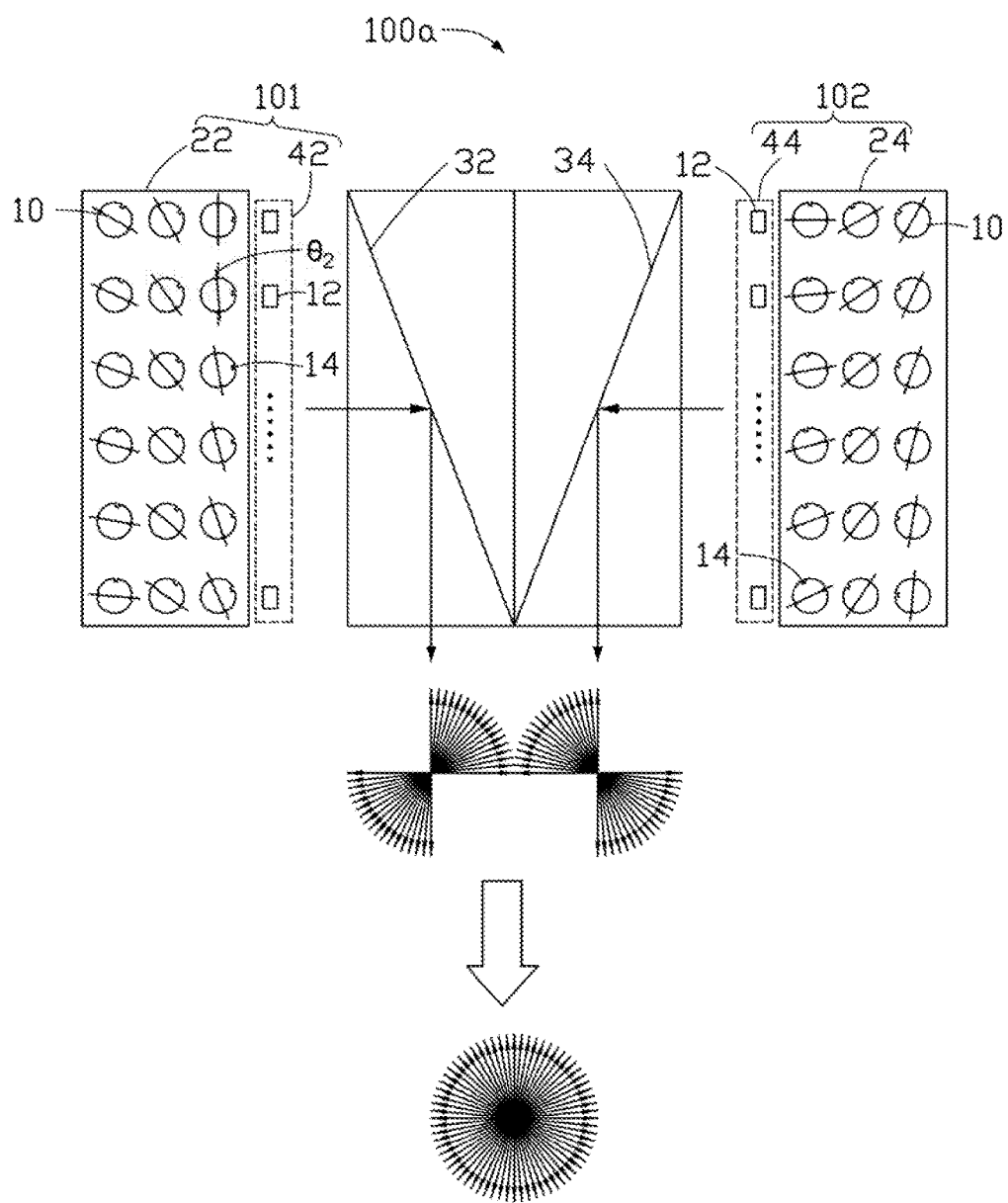
FIG. 6 is a structure diagram of a fourth embodiment of a laser light source device.

Referring to FIGS. 4-6, a laser light source device 100*a* comprises a first laser diode module 101 and a second laser diode module 102. The first laser diode module 101 comprises a second laser diode light source array 22 and a second collimation lens array 42. The second laser diode light source array 22 can comprise N number of laser diodes 10 and the second collimation lens array 42 can comprise N number of collimation lenses 12. Each collimation lens 12 of the second collimation lens array 42 corresponds to a different laser diode 10 of the second laser diode light source array 22. The second laser diode module 102 comprises a third laser diode light source array 24 and a third collimation lens array 44. The third laser diode light source array 24 can comprise M number of laser diodes 10 and the third collimation lens array 44 can comprise M number of collimation lenses 12. Each collimation lens 12 of the third collimation lens array 44 corresponds to a different laser diode 10 of the third laser diode light source array 24.

For example, the second laser diode light source array 22 comprises eighteen laser diodes 10 (N=18) and the second collimation lens array 42 comprises eighteen collimation lenses 12. The eighteen laser diodes 10 of the second laser diode light source array 22 are arranged in a matrix array of 3*6 and numbered as 1st, 2th, 3th, . . . , 18th. The third laser diode light source array 24 comprises eighteen laser diodes 10 (M=18) and the third collimation lens array 44 comprises eighteen collimation lenses 12. The eighteen laser diodes 10 of the third laser diode light source array 24 are arranged in a matrix array of 3*6 and numbered as 1st, 2th, 3th, . . . , 18th.

In the first laser diode module 101, a gradual rotation angle is defined through the N number of laser diodes 10, and an orientation of a position portion 14 of an Nth laser diode 10 and an orientation of a position portion 14 of an (N−1)th laser diode 10 form a second angle with an angle difference of θ2.

In the second laser diode module 102, a gradual rotation angle is also defined through the M number of laser diodes 10. If M is equal to N, an orientation of a position portion 14 of an Mth laser diode 10 and an orientation of a position portion 14 of an (M−1)th laser diode 10 form the second angle difference of θ2.

In one embodiment, each laser diode 10 of the second laser diode light source array 22 has the same wavelength and each laser diode 10 of the third laser diode light source array 24 has the same wavelength. A wavelength of the laser diode 10 of the second laser diode light source array 22 can be different to or same as a wavelength of the laser diode 10 of the third laser diode light source array 24.

As shown in FIG. 4, the first laser diode module 101 is located opposite to the second laser diode module 102 and M is equal to N. The second angle difference θ2 can be calculated by the following formula: (180°/N)*i, N and i are positive integers. An angle difference between an orientation of the position portion 14 of 1st laser diode 10 of the third laser diode light source array 24 and an orientation of the position portion 14 of 1st laser diode 10 of the second laser diode light source array 22 is equal to 0 degree. An orientation angle of the position portions 14 of 1st to 18th laser diodes 10 of the second laser diode light source array 22 can be set as 0, θ2, 2*θ2, 3*θ2, (N−1)*θ2. An orientation angle of the position portions 14 of 1st to 18th laser diodes 10 of the third laser diode light source array 24 can be set as 0, θ2, 2*θ2, 3*θ2, (N−1)*θ2.

As shown in FIG. 4, i is equal to 1, 1st laser diode 10 of the second laser diode light source array 22 is located at a top right corner and 18th laser diode 10 of the second laser diode light source array 22 is located at a bottom left corner. 1st laser diode 10 of the third laser diode light source array 24 is located at a top left corner, and 18th laser diode 10 of the third laser diode light source array 24 is located at a bottom right corner.

In one embodiment, the laser light source device 100*a* further comprises a second reflector 32 and a third reflector 34. The second reflector 32 reflects a non-polarized beam outputted from the second collimation lens array 42 into a first non-polarized sub-beam, the third reflector 34 reflects a non-polarized beam outputted from the third collimation lens array 44 into a second non-polarized sub-beam. The non-polarized beam outputted by the laser light source device 100*a* is formed by the first and second sub-beams.

As shown in FIG. 5, the second angle difference θ2 can be calculated by the following formula: (180°/N)*i, N and i are positive integers. An angle difference between an orientation of the position portion 14 of 1st laser diode 10 of the third laser diode light source array 24 and an orientation of the position portion 14 of the Nth laser diode 10 of the second laser diode light source array 22 is equal to one half of the second angle difference θ2. An orientation angle of the position portions 14 of 1st to 18th laser diodes 10 of the second laser diode light source array 22 can be set as 0, θ2, 2*θ2, 3*θ2, (N−1)*θ2. An orientation angle of the position portions 14 of 1st to 18th laser diodes 10 of the third laser diode light source array 24 can be set as ½*θ2, 3/2*θ2, 5/2*θ2, 7/2*θ2, (2N−1)/2*θ2.

As shown in FIG. 5, 1st laser diode 10 of the second laser diode light source array 22 is located at a top right corner and 18th laser diode 10 of the second laser diode light source array 22 is located at a bottom left corner. 1st laser diode 10 of the third laser diode light source array 24 is located at a top left corner and 18th laser diode 10 of the third laser diode light source array 24 is located at a bottom right corner. A light energy density of the first non-polarized sub-beam is higher than a light energy density of the non-polarized beam outputted from the second collimation lens array 42, and a light energy density of the second non-polarized sub-beam is higher than a light energy density of the non-polarized beam outputted from the third collimation lens array 44.

As shown in FIG. 6, the second angle difference θ2 can be calculated by the following formula: (180°/(N+M))*i, N and i are positive integers. An orientation angle of the position portion 14 of a 1st laser diode 10 of the third laser diode light source array 24 continues an orientation angle of the position portion 14 of an Nth laser diode 10 of the second laser diode light source array 22. An angle difference between an orientation of the position portion 14 of 1st laser diode 10 of the third laser diode light source array 24 and an orientation of the position portion 14 of the Nth laser diode 10 of the second laser diode light source array 22 is equal to the second angle difference θ2.

If i is greater than 1, the first laser diode module 101 and the second laser diode module 102 are divided into i number of blocks. A gradual rotation angle through the blocks is equal to the second angle difference θ2.

In the second laser diode light source array 22, an angle difference between an orientation of a position portion 14 of a 1st laser diode 10 of each block is equal to 0 degree. That is, in the second laser diode light source array 22, an angle difference between an orientation of a position portion 14 of a 1st laser diode 10 and an orientation of a position portion 14 of an ((N/i)+1)th laser diode 10, a (2*(N/i)+1)th laser diode 10, . . . , or an ((i−1)*(N/i)+1)th laser diode 10 is equal to 0 degree.

In the third laser diode light source array 24, an angle difference between an orientation of a position portion 14 of a 1st laser diode 10 of each block is equal to 0 degree. That is, in the third laser diode light source array 24, an angle difference between an orientation of a position portion 14 of a 1st laser diode 10 and an orientation of a position portion 14 of an ((N/i)+1)th laser diode 10, a (2*(N/i)+1)th laser diode 10, . . . , or a ((i−1)*(N/i)+1)th laser diode 10 is equal to 0 degree.

An orientation angle of the position portions 14 of 1st to 18th laser diodes 10 of the second laser diode light source array 22 can be set as 0, θ2, 2*θ2, 3*θ2, (N−1)*θ2. An orientation angle of the position portions 14 of 1st to 18th laser diodes 10 of the third laser diode light source array 24 can be set as N*θ2, (N+1)*θ2, (N+2)*θ2, (N+3)*θ2, . . . , (2N−1)*θ2.

As shown in FIG. 6, 1st laser diode 10 of the second laser diode light source array 22 is located at a top right corner and 18th laser diode 10 of the second laser diode light source array 22 is located at a bottom left corner. 1st laser diode 10 of the third laser diode light source array 24 is located at a top left corner and 18th laser diode 10 of the third laser diode light source array 24 is located at a bottom right corner. The light energy density of the first non-polarized sub-beam is higher than the light energy density of the non-polarized beam outputted from the second collimation lens array 42, and the light energy density of the second non-polarized sub-beam is higher than the light energy density of the non-polarized beam outputted from the third collimation lens array 44. The first non-polarized sub-beam is located at first and third quadrants and the second non-polarized sub-beam is located at second and fourth quadrants.

The embodiments shown and described above are only examples. Many details known in the field are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A laser light source device comprising:
   a laser diode light source array comprising N number of laser diodes; and
   a collimation lens array comprising a plurality of collimation lenses, each of the plurality of collimation lenses corresponding to a different laser diode of the N number of laser diodes;
   wherein an outer shell of each laser diode defines a position portion, a gradual rotation angle is defined among each of the N number of laser diodes, and an orientation of a position portion of a Nth laser diode and an orientation of a position portion of a (N−1)th laser diode form a predetermined angle difference.

2. The laser light source device of claim 1, wherein the predetermined angle difference is: (180°/N)*i, and i is a positive integer.

3. The laser light source device of claim 1, wherein each laser diode has the same wavelength.

4. The laser light source device of claim 1, further comprising a reflector, wherein the reflector reflects a first non-polarized beam outputted from the collimation lens array into a second non-polarized beam.

5. The laser light source device of claim 4, wherein a light energy density of the second non-polarized beam is higher than a light energy density of the first non-polarized beam.

6. A laser light source device comprising:
   a first laser diode module comprising:
      a first laser diode light source array comprising N number of first laser diodes; and
      a first collimation lens array comprising a plurality of first collimation lenses, each of the plurality of first collimation lenses corresponding to a different first laser diode of the N number of first laser diodes; and
   a second laser diode module comprising:
      a second laser diode light source array comprising M number of second laser diodes; and
      a second collimation lens array comprising a plurality of second collimation lenses, each of the plurality of second collimation lenses corresponding to a different second laser diode of the M number of second laser diodes;
   wherein an outer shell of each first laser diode and an outer shell of each second laser diode each define a position portion, a first gradual rotation angle is defined among each of the N number of first laser diodes, and an orientation of a position portion of a Nth first laser diode and an orientation of a position portion of a (N−1)th first laser diode form a first predetermined angle difference; and a second gradual rotation angle is defined among each of the M number of second laser diodes, and an orientation of a position portion of a Mth second laser diode and an orientation of a position portion of a (M−1)th second laser diode form a second predetermined angle difference.

7. The laser light source device of claim 6, wherein a beam outputted by the first laser diode module and a beam outputted by the second laser diode module combine a non-polarized beam with an angle approximating 360 degrees.

8. The laser light source device of claim 6, wherein the first laser diode module is located opposite to the second laser diode module.

9. The laser light source device of claim 8, wherein the first predetermined angle difference is: (180°/N)*i, the second predetermined angle difference is: (180°/M)*i, and i is a positive integer.

10. The laser light source device of claim 9, wherein an angle difference between the orientation of the position portion of the Nth first laser diode and the orientation of the position portion of the Mth second laser diode is equal to the first predetermined angle difference.

11. The laser light source device of claim 9, wherein an angle difference between the orientation of the position portion of the Nth first laser diode and the orientation of the position portion of the Mth second laser diode is equal to one half of the second predetermined angle difference.

12. The laser light source device of claim 8, wherein the first predetermined angle difference and the second predetermined angle difference both are: (180°/(N+M))*i, and i is a positive integer.

13. The laser light source device of claim 12, wherein an orientation of a position portion of a 1st second laser diode continues the orientation of the position portion of the Nth first laser diode, and an angle difference between the orientation of the position portion of 1st second laser diode and the orientation of the position portion of the Nth first laser diode is equal to $(180°/(N+M))*i$.

14. The laser light source device of claim 13, wherein when i is greater than 1, the first laser diode module and the second laser diode module are respectively divided into i number of blocks, a gradual rotation angle among each of the blocks is equal to $(180°/(N+M))*i$, an angle difference between an orientation of a position portion of a 1st first laser diode and an orientation of a position portion of a $((N/i)+1)$th first laser diode, a $(2*(N/i)+1)$th first laser diode, ..., or an $((i-1)*(N/i)+1)$th first laser diode is equal to 0 degree; and an angle difference between an orientation of a position portion of a 1th second laser diode and an orientation of a position portion of an $((M/i)+1)$th second laser diode, a $(2*(M/i)+1)$th second laser diode, ..., or a $((i-1)*(M/i)+1)$th second laser diode is equal to 0 degree.

15. The laser light source device of claim 6, wherein a wavelength of the first laser diode is different from a wavelength of the second laser diode.

16. The laser light source device of claim 6, further comprising a first reflector and a second reflector, wherein the first reflector reflects a first non-polarized beam outputted from the first collimation lens array into a first non-polarized sub-beam, the second reflector reflects a second non-polarized beam outputted from the second collimation lens array into a second non-polarized sub-beam, and the first non-polarized sub-beam and the second non-polarized sub-beam form a third non-polarized beam with an angle approximating of 360 degrees.

17. The laser light source device of claim 16, wherein a light energy density of the first non-polarized sub-beam is higher than a light energy density of the first non-polarized beam outputted from the first collimation lens array, and a light energy density of the second non-polarized sub-beam is higher than a light energy density of the second non-polarized beam outputted from the second collimation lens array.

* * * * *